(12) United States Patent
Hong et al.

(10) Patent No.: US 11,690,167 B2
(45) Date of Patent: Jun. 27, 2023

(54) PRINTED CIRCUIT BOARD AND ELECTRONIC DEVICE INCLUDING SAME

(71) Applicant: Samsung Electronics Co., Ltd., Suwon-si (KR)

(72) Inventors: Eunseok Hong, Suwon-si (KR); Gyounghwan Park, Suwon-si (KR); Cheolyoon Chung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 257 days.

(21) Appl. No.: 16/880,703

(22) Filed: May 21, 2020

(65) Prior Publication Data

US 2021/0068247 A1    Mar. 4, 2021

(30) Foreign Application Priority Data

Aug. 29, 2019  (KR) .................. 10-2019-0106670

(51) Int. Cl.
| | |
|---|---|
| *H05K 1/02* | (2006.01) |
| *H05K 1/18* | (2006.01) |
| *H04N 25/70* | (2023.01) |

(52) U.S. Cl.
CPC ........... *H05K 1/0245* (2013.01); *H04N 25/70* (2023.01); *H05K 1/028* (2013.01); *H05K 1/0218* (2013.01);
(Continued)

(58) Field of Classification Search
CPC .. H05K 1/0216; H05K 1/0219; H05K 1/0228; H05K 1/0236; H05K 1/0245;
(Continued)

(56) References Cited

U.S. PATENT DOCUMENTS

| | | | | |
|---|---|---|---|---|
| 5,357,050 A | * | 10/1994 | Baran .................. | H05K 1/0228 174/33 |
| 6,246,112 B1 | * | 6/2001 | Ball .................. | H01L 23/49822 257/691 |
| 6,737,589 B2 | * | 5/2004 | Adachi .................. | H05K 3/281 174/257 |
| 9,433,081 B1 | * | 8/2016 | Xiong .................. | H05K 1/0216 |

(Continued)

FOREIGN PATENT DOCUMENTS

| | | |
|---|---|---|
| CN | 202634878 U | 12/2012 |
| JP | 2005-268602 A | 9/2005 |

(Continued)

OTHER PUBLICATIONS

International Search Report dated Aug. 26, 2020 in connection with International Patent Application No. PCT/KR2020/006575, 3 pages.
Written Opinion of the International Searching Authority dated Aug. 26, 2020 in connection with International Patent Application No. PCT/KR2020/006575, 5 pages.

*Primary Examiner* — Roshn K Varghese

(57) ABSTRACT

According to various embodiments, a printed circuit board may include: a first wiring layer including at least one first signal line and at least one first dummy line; and a second wiring layer arranged on the first wiring layer and including at least one second signal line and at least one second dummy line, wherein when the printed circuit board is viewed from above, the at least one first signal line may be arranged to overlap, at least in part, the at least one second dummy line, and the at least one second signal line may be arranged to overlap, at least in part, the at least one first dummy line.

19 Claims, 7 Drawing Sheets

(52) U.S. Cl.
CPC ....... *H05K 1/181* (2013.01); *H05K 2201/093* (2013.01); *H05K 2201/09227* (2013.01); *H05K 2201/10121* (2013.01); *H05K 2201/10128* (2013.01); *H05K 2201/10151* (2013.01)

(58) Field of Classification Search
CPC ...... H05K 1/0218; H05K 1/028; H05K 1/181; H05K 1/0298; H05K 1/0246; H05K 2201/09781; H05K 2201/09227; H05K 2201/093; H05K 2201/10121; H05K 2201/10128; H05K 2201/10151; H05K 2201/097; H05K 2201/09672; H04N 5/369

See application file for complete search history.

(56) References Cited

U.S. PATENT DOCUMENTS

| | | |
|---|---|---|
| 2012/0164942 A1 | 6/2012 | Mohammadian |
| 2013/0153266 A1 | 6/2013 | Hyun et al. |
| 2016/0226734 A1 | 8/2016 | Pandey et al. |
| 2019/0088388 A1* | 3/2019 | Baba ........................ H01P 3/088 |
| 2019/0266119 A1* | 8/2019 | Wiley ................. G06F 13/4068 |

FOREIGN PATENT DOCUMENTS

| | | |
|---|---|---|
| JP | 2008-187042 A | 8/2008 |
| KR | 10-2012-0129687 A | 11/2012 |

\* cited by examiner

PRINTED CIRCUIT BOARD AND ELECTRONIC DEVICE INCLUDING SAME

CROSS-REFERENCE TO RELATED APPLICATION

This application is based on and claims priority under 35 U.S.C. § 119 to Korean Patent Application No. 10-2019-0106670 filed on Aug. 29, 2019 in the Korean Intellectual Property Office, the disclosure of which is incorporated by reference herein in its entirety.

BACKGROUND

1. Field

Various embodiments disclosed in this document relate to a printed circuit board, for example, to a printed circuit board that transmits electric signals between electronic components using 3-phase interfaces and/or an electronic device including the same.

2. Description of Related Art

The development of electronic, information, and communication technologies has brought about integration of various functions into a single electronic device. For example, a smartphone includes functions, such as audio reproduction, photographing, or an electronic organizer, as well as functions for communication, and more various functions may be implemented in the smartphone through installation of additional applications. The electronic device may access a server or another electronic device in a wired or wireless manner, as well as executing installed applications or stored files, thereby receiving a variety of information in real time.

Various functions provided in a single electronic device (i.e., a smartphone) improve the convenience of using the electronic device, and the use of such an electronic device is becoming common and generalized in daily lives. The diversity of functions in electronic devices described above may require high performance of electronic components, such as a processor, in processing data signals and a high speed in exchange of electric signals between the electronic components. On the other hand, the electronic devices may be further miniaturized for daily use, for example, to facilitate carrying the electronic devices anywhere and anytime.

SUMMARY

A printed circuit board may include a plurality of signal lines for exchanging electric signals, thereby providing a means for exchanging electric signals between a plurality of electronic components. The methods of transmitting electric signals in the interior of the electronic device may be classified according to the configuration or combination of electrical wires. For example, the methods of transmitting electric signals may be divided into a single input mode in which signals are transmitted using a single input terminal and a double input mode in which signals are transmitted using two input terminals. Among the above signal transmission methods, a method of transmitting signals, based on a differential mode, in a method of inputting signals to two or more signal lines, may be referred to as a "differential mode transmission method (differential signal transmission method)". For example, the differential signal transmission method may be used in order to obtain the better signal quality and transmission speed. The differential signal may denote a signal of which the phases are opposite to each other in two transmission lines thereof. For example, when transmitting a given signal through two signal lines, the same signals having a phase difference of 180 degrees may be transmitted through two signal lines, and a receiving end may make a difference between the two signals using a differential amplifier.

In the differential signal transmission method, it is possible to further improve a transmission speed using 3-phase interfaces, for example, three signal lines. As described above, when transmitting the same data signal, two or three signal lines, instead of a single signal line, may be used, thereby further improving the signal quality and transmission speed. It is possible to reduce the influence of electrical noise and distortion when transmitting signals using two or more signal lines. This is due to the fact that, for example, in the case where external noise affects two or more signal lines, the noise is able to be offset or canceled in the same manner as a common mode filter.

According to various embodiments, although the signal lines are spaced at a predetermined distance apart from each other in order to avoid electromagnetic interference in the printed circuit board, the area necessary for wiring the signal lines may be further required to be increased in proportion to an increase in the number of signal lines for exchanging electric signals or data signals. As the area for wiring the signal lines increases, it may be difficult to miniaturize the printed circuit board. For example, although the signal quality and transmission speed are able to be improved by implementing a differential signal transmission method using two or more signal lines, since the size of a printed circuit board is limited in a miniaturized electronic device, for example, a mobile communication terminal, it may be difficult to arrange or provide the signal lines. Moreover, as electronic components, such as optical sensors (for example, image sensors in camera modules), displays, and acoustic devices have high performance, or as more diverse sensors (for example, fingerprint sensors or iris/face recognition sensors) are mounted to a single electronic device, better signal quality and transmission speed between electronic components are required. Although an additional area is required to add a plurality of signal lines, since the area of the printed circuit board is limited, it may be difficult to secure an area for further arranging the signal lines.

Certain embodiments according to this disclosure provide a printed circuit board having a structure capable of arranging more signal lines in the same area or arranging the same number of signal lines in a smaller area and/or an electronic device including the same.

Certain embodiments according to the present disclosure provide a printed circuit board capable of avoiding electromagnetic interference between signal lines while arranging the same number of signal lines in a smaller area and/or an electronic device including the same.

Certain embodiments according to this disclosure provide a printed circuit board capable of rapidly transmitting electric signals by selecting three signal lines from among the signal lines arranged in two adjacent wiring layers and an electronic device including the same.

In various embodiments according to this disclosure, a printed circuit board includes a first wiring layer including at least one first signal line and at least one first dummy line; and a second wiring layer arranged on the first wiring layer and including at least one second signal line and at least one second dummy line, wherein when the printed circuit board is viewed from above, the at least one first signal line may be arranged to overlap, at least in part, the at least one second dummy line, and the at least one second signal line may be arranged to overlap, at least in part, the at least one first dummy line.

According to various embodiments of this disclosure, an electronic device includes a printed circuit board; a processor; and at least one electronic component electrically connected to the processor through the printed circuit board, wherein the printed circuit board may include: a first wiring layer including a plurality of first signal lines and a plurality of first dummy lines; and a second wiring layer including a plurality of second signal lines and a plurality of second dummy lines, wherein each of the first signal lines may be arranged to face one of the second dummy lines, and each of the second signal lines may be arranged to face one of the first dummy lines, and wherein the processor may be configured to transmit or receive an electrical signal to or from the electronic component through signal lines selected from the first signal lines and the second signal lines.

A printed circuit board according to various embodiments of this disclosure may be configured such that, in a plurality of (for example, two) wiring layers, each including a plurality of signal lines and a plurality of dummy lines, which are arranged alternately with each other, electric signals (for example, differential signals) are transmitted through a combination of a plurality of (for example, three) signal lines, thereby improving a transmission speed. In some embodiments, at least one of a plurality of (for example, three) signal lines combined for the transmission of signals is arranged on a wiring layer different from the remaining signal lines, thereby reducing the distance between the signal lines that are adjacent and in parallel to each other on one surface of the printed circuit board. As an illustrative example, in a combination of signal lines, compared to a structure in which one wiring layer has a combination of three signal lines, a printed circuit board according to various embodiments of this disclosure may include the same number of signal lines in a narrower width or area in the direction parallel to one surface of the printed circuit board. In certain embodiments, dummy lines may provide an electromagnetic shielding structure between adjacent signal lines, thereby avoiding electromagnetic interference between two signal lines arranged adjacent to each other on the same wiring layer or between two signal lines adjacent to each other while being arranged on different wiring layers. By way of non-limiting example, a stable electromagnetic shielding structure is able to be provided between three adjacent signal lines, thereby improving the transmission signal quality between electronic components.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 7, discussed below, and the various embodiments used to describe principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
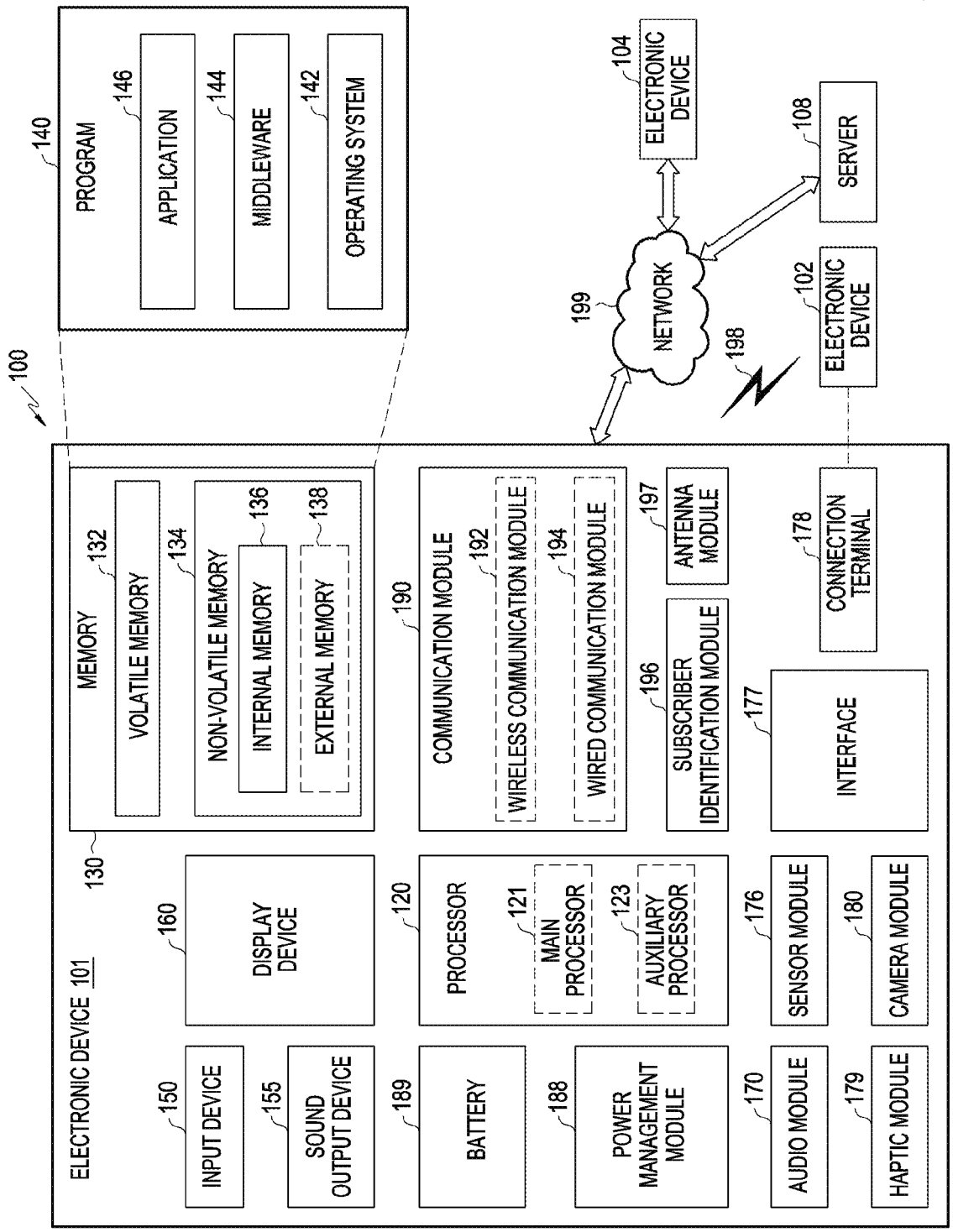
FIG. 1 illustrates, in block diagram format, an example of an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various embodiments, electronic components of an electronic device 100 (for example, the processor 120, the memory 130, the display device 160, the audio module 170, the sensor module 176, the interface 177, the connection terminal 178, the camera module 180, and the communication module 190) may be mounted on a first printed circuit board (e.g., a primary circuit board), or some of them may be mounted on a second printed circuit board (for example, a secondary circuit board) in the electronic device. According to some embodiments, some other electronic components may be mounted to the positions independent of the first printed circuit board or the second printed circuit board, and may be electrically connected to another printed circuit board (for example, the first printed circuit board or the second printed circuit board) through a third printed circuit board (for example, a flexible printed circuit board). The electronic components may be electrically connected to other electronic components through the signal wire(s) provided by the printed circuit board(s). The printed circuit board, which will be described later, may be at least a part of the printed circuit board(s) disposed inside the electronic device. In some embodiments, the printed circuit board to be described later may be interpreted to encompass a rigid printed circuit board or a flexible printed circuit board.

In the following detailed description, when "n" is a natural number, the expression "the $n+1^{st}$ wiring layer stacked on the $n^{th}$ wiring layer" encompasses a structure in which another wiring layer or an insulation layer is interposed between the $n^{th}$ wiring layer and the n+1st wiring layer. In some embodiments, in the case where the $n^{th}$ wiring layer and the $n+1^{st}$ wiring layer are arranged or formed adjacent to each other, at least one insulation layer may be interposed between the $n^{th}$ wiring layer and the $n+1^{st}$ wiring layer. Some of the signal line(s), the dummy line(s), or the ground conductor(s), which are arranged on different wiring layers, may be electrically connected to each other. In certain embodiments, a printed circuit board according to various embodiments disclosed in this document may include via-holes or via-conductors that are formed to penetrate through the insulation layer(s), thereby electrically connecting some of the signal line(s), the dummy line(s), or the ground conductor(s) arranged on different wiring layers to each other.

According to various embodiments, the printed circuit board may include multiple (for example, 12) wiring layers sequentially stacked, and an insulation layer (or dielectric layer) may be provided between two adjacent wiring layers. The printed circuit board in certain examples provided in this disclosure may be at least a part of a printed circuit board including multiple (for example, 12) wiring layers. In another embodiment, the printed circuit board may include other insulation layers on both surfaces (for example, upper and lower surfaces) thereof, thereby protecting the wiring layers arranged at the outermost from an external environment. The wiring layers (or insulation layers) expressed as ordinal numbers such as "first" and "second" may represent any one of the multiple (for example, 12) wiring layers (or insulation layers) constituting the printed circuit board, and the correlation of the wiring layers and/or the insulation layers may be defined according to the configuration described in the claims.

Figure 2:
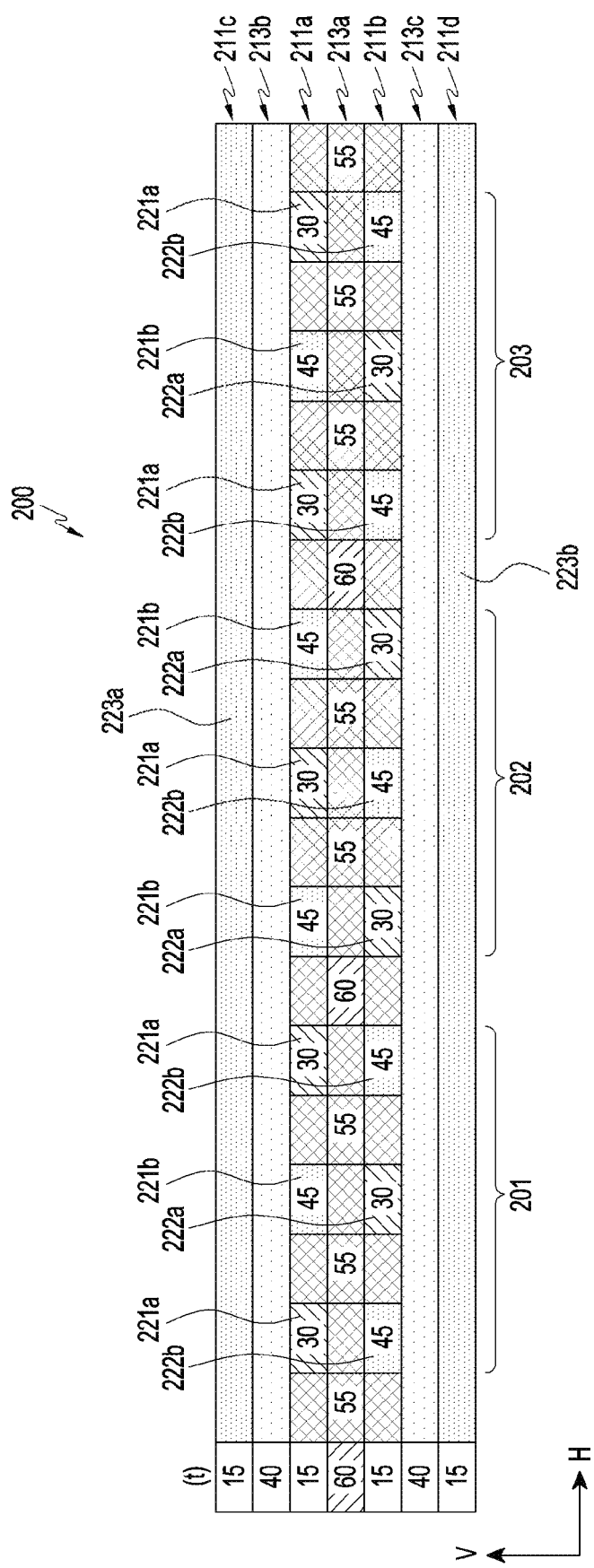
FIG. 2 illustrates, in cross-sectional view, an example of a configuration of a printed circuit board according to various embodiments of this disclosure.

FIG. 2 illustrates, in cross-sectional view, an example of a configuration of a printed circuit board 200 according to various embodiments of this disclosure.

Referring to the non-limiting example of FIG. 2, the numerical values in the first column on the left represent the thicknesses (t) of wiring layers 211a, 211b, 211c, and 211d and the insulation layers 213a, 213b, and 213c; the numerical values in the wiring layers 211a, 211b, 211c, and 211d represent the line widths of the signal lines 221a and 222a or the dummy lines 221b and 222b; and the numerical values in the insulation layers 213a, 213b, and 213c represent the distances between two adjacent signal lines (for example, a first signal line 221a and a second signal line 222a adjacent thereto) in the horizontal direction H (for example, the direction parallel to one surface of the printed circuit board 200). In this example, the units of the numerical values shown in the figure are micrometers (μm). The numerical values described in the drawing are only examples in order to explain the wiring structure through comparison with another wiring structure having equivalent performance (for example, an existing printed circuit board 20, such as shown in the example of FIG. 3), and are not intended to limit the disclosure.

Referring to the example of FIG. 2, the printed circuit board 200 may include a first wiring layer 211a including a plurality of first signal lines 221a and a plurality of first dummy lines 221b, and a second wiring layer 211b including a plurality of second signal lines 222a and a plurality of second dummy lines 222b. The signal lines 221a and 222a and the dummy lines 221b and 222b may be printed circuit patterns formed of an electrically conductive material. According to at least one embodiment, the first signal lines 221a may be alternately arranged with the first dummy lines 221b in the horizontal direction H. In some embodiments, the second signal lines 222a may be alternately arranged with the second dummy lines 222b in the horizontal direction H. According to certain embodiments, the second wiring layer 211b may be stacked on the first wiring layer 211a. In the vertical direction V (for example, in the thickness direction of the printed circuit board 200), each of the first signal lines 221a may be arranged to be symmetrical, at least in part, with one of the second dummy lines 222b, or may be arranged to face each other, and each of the second signal lines 222a may be arranged to be symmetrical, at least in part, with one of the first dummy lines 221b, or may be arranged to face each other. According to certain embodiments, when the printed circuit board 200 is viewed from above, the first signal line 221a and the second dummy line 222b may be arranged at least in part to overlap each other, and the second signal line 222a and the first dummy line 221b may be arranged at least in part to overlap each other.

Figure 3:
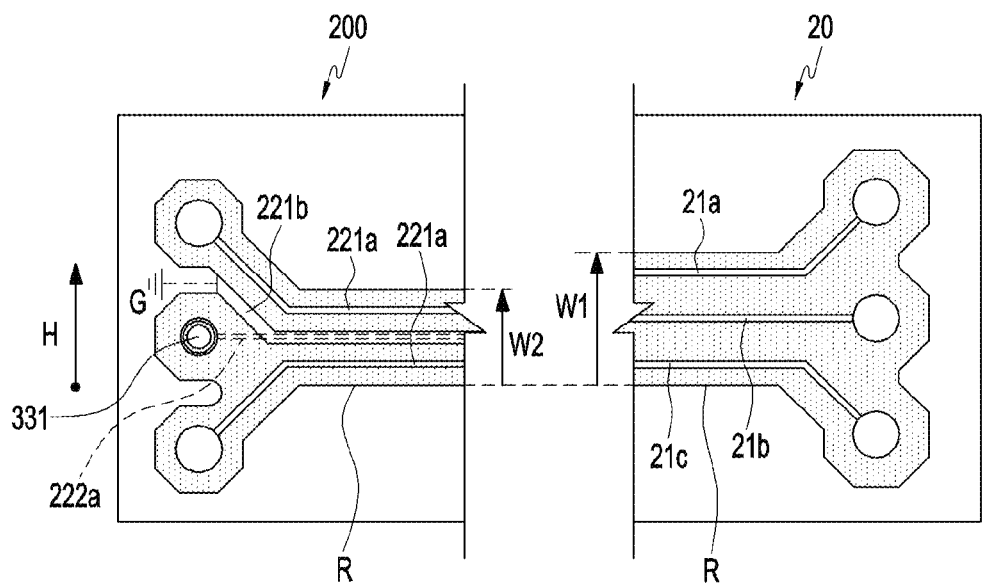
FIG. 3 illustrates, in enlarged plan view, an example of a portion of a printed circuit board according to various embodiments of this disclosure.

According to various embodiments, the dummy lines 221b and 222b may be connected to a ground plane (for example, a first ground plane 223a, a second ground plane 223b, or the ground G in FIG. 3), and may provide a shielding structure for blocking electromagnetic waves between the signal lines 221a and 222a. For example, when transmitting electric signals, the dummy lines 221b and 222b may block electromagnetic interference between the signal lines 221a and 222a. According to certain embodiments, in providing an electromagnetic wave shielding structure, the dummy lines 221b and 222b may have line widths greater than the signal lines 221a and 222a. For example, in the case where the signal lines 221a and 222a have a line width of approximately 30 micrometers, the dummy lines 221b and 222b may have a line width of approximately 45 micrometers. The dummy lines 221b and 222b may have a larger line width than the signal lines 221a and 222a, thereby providing a more stable shielding structure. According to certain embodiments, a method for blocking electromagnetic interference may be implemented in a manner other than the method of forming a larger line width. For example, the dummy lines 221b and 222b may be made of other materials for blocking electromagnetic waves. Conductive materials may be provided to block electromagnetic waves. For example, a conductive coating in the form of a thin metal film of aluminum (AL) or copper (CU), which is effective for shielding against an electric field, may be provided for electromagnetic wave shielding or noise shielding. In some embodiments, if the dummy lines 221b and 222b are formed based on composite materials of polymers and nanoparticles, carbon, ceramics, or metals, the dummy lines 221b and 222b may provide a stable shielding structure with a small line width. Although in certain embodiments shown in this disclosure, the dummy lines 221b and 222b are configured to be connected to the ground planes 223a and 223b, the disclosure is not limited thereto. For example, some of the dummy lines 221b and 222b may provide an electromagnetic shielding structure between the signal lines 221a and 222a without being connected to the ground planes 223a and 223b, and in some embodiments, some of the dummy lines 221b and 222b may be used in transmitting other electric signals, separately from the signal lines 221a and 222a. According to various embodiments, it should be noted that the "ground plane" provides electrical grounding and does not mean a mechanical shape such as a flat plate. For example, the "ground plane" may be a part of a conductive printed structure or a conductive layer provided in the printed circuit board 200.

According to various embodiments, the printed circuit board 200 may transmit signals through a combination of a plurality of signal lines. For example, the printed circuit board 200 may provide 3-phase interfaces 201, 202, and 203 by combining one of the first signal lines 221a with two of the second signal lines 222a adjacent thereto or combining one of the second signal lines 222a with two of the first signal lines 221a adjacent thereto. For example, in the printed circuit board 200, three of the signal lines 221a and 222a adjacent to each other (or sequentially arranged) in the horizontal direction H may be selected or combined for transmitting electric signals. According to certain embodiments, when transmitting electric signals, two of the selected three signal lines 221a and 222a may transmit a differential signal, and the remaining one may be in a high-impedance (Hi-Z) state. For example, if a signal line other than the signal line transmitting a differential signal is in a high-impedance state, the impedance (AC resistance) becomes large. In certain embodiments, in order to prevent collision or interference between different signal lines and reduce the influence of signals or data transmitted through other signal lines, the signal line may be in a high-impedance state. The signal lines transmitting a differential signal may be any two of the three selected signal lines 221a and 222a. The printed circuit board 200 may provide 3-phase interfaces 201, 202, and 203 by combining three signal lines selected from the signal lines 221a and 222a, and the electronic components exchanging electric signals through the printed circuit board 200 (for example, the electronic components such as the processor 120 in FIG. 1) may transmit or receive electric signals using the 3-phase interfaces 201, 202, and 203.

According to various embodiments, when transmitting signals using 3-phase interfaces (for example, the 3-phase interfaces 201, 202, and 203), the electronic components may transmit the signals, based on mobile industry processor interface (MIPI) standards. MIPI is an interface standard for connecting a mobile application processor (AP) and peripheral devices. The physical layer of MIPI is divided into M-Phy, D-Phy, and C-Phy, and D-Phy and C-Phy may be used in cameras and display devices. The signal line configuration in various embodiments disclosed in this document is not limited to the MIPI-based 3-phase interfaces, and may be used in other signal line configurations. Modules inside the electronic device may exchange data signals, power, or control signals with each other through signal transmission circuits (for example, the 3-phase interfaces 201, 202, and 203). According to certain embodiments, a line interface in which signals are transmitted by D-Phy and C-Phy, respectively, is defined for transmitting signals between modules connected through an MIPI interface in a (mobile) electronic device (for example, a modem, a high-frequency integrated circuit chip, an audio module, a Bluetooth module, and a power source). In some embodiments, the electronic device may transmit and receive signals, based on the line interface defined in MIPI.

According to various embodiments, it should be noted that the transmission of electric signals is not limited to the method using the 3-phase interfaces 201, 202, and 203 in the printed circuit board 200. For example, some electronic components in the actual electronic device may exchange electric signals through any one of the signal lines 221a and 222a or the dummy lines 221b and 222b, and some other electronic components may exchange electric signals through a combination of any two of the signal lines 221a and 222a or dummy lines 221b and 222b. For example, a plurality of signal lines may be variably selected and used depending on the state or situation of the electronic device. For example, in the case where high-speed data transmission or large data transmission is required, or in the case where a problem occurs in at least some of the selected signal lines, a plurality of other signal lines may be further selected, and a circuit for transmitting signals may be variably configured through a combination of a plurality of signal lines, thereby transmitting signals. In various embodiments, the printed circuit board 200 may further include other signal lines that are not illustrated, and the signal lines that are not illustrated may also transmit electric signals between the electronic components in the electronic device. In some embodiments, data transmission between modules in the electronic device may require a high transmission speed. For example, when a processor (for example, the main processor 121 or the auxiliary processor 123 such as an image signal processor in FIG. 1) exchanges data signals with electronic components such as a high-performance camera or an ultra-high definition display, transmission speeds of up to, for example, several tens of Gbps may be required. In the case where high-speed signal transmission is required as described above, the signal lines must be arranged so as to avoid problems such as signal loss, interference, and the like. For example, a shielding layer to prevent signal interference between two signal lines must be arranged at regular intervals. However, as the space necessary for the shielding layer between the signal lines increases, the space necessary for mounting the signal lines increases. Thus, high-speed data transmission may be performed using the 3-phase interfaces.

According to various embodiments, an electronic component (for example, the processor 120 in FIG. 1) may receive and process an image signal (or image data) from another electronic component (for example, the camera module 180 in FIG. 1) including an optical sensor, and may transmit the processed data to an electronic component such as a memory (for example, the memory 130 in FIG. 1) or a display (for example, the display device 160 in FIG. 1). As mentioned above, the electronic component may use the 3-phase interfaces 201, 202, and 203 in receiving or transmitting an image signal. It should be noted that examples in this disclosure illustrate transmitting an image signal through configurations with three selected signal lines 221a and 222a, the disclosure is not limited thereto. For example, the signal lines 221a and 222a or the 3-phase interfaces 201, 202, and 203 may be used even in connecting various electronic components to each other in the electronic device, such as a signal wire connecting the processor 120 to the communication module 190, a signal wire connecting the processor 120 to the connection terminal 178 or the interface 177, and a signal wire connecting the processor 120 to the audio module 170 in FIG. 1. In some embodiments, the signal lines 221a and 222a or the 3-phase interfaces 201, 202, and 203 may transmit data signals for images, sounds, or the like, control signals for controlling other electronic components, or power.

According to various embodiments, the printed circuit board 200 may further include a third wiring layer 211c including a first ground plane 223a and a fourth wiring layer 211d including a second ground plane 223b. According to certain embodiments, the first wiring layer 211a and the second wiring layer 211b may be arranged between the third wiring layer 211c and the fourth wiring layer 211d. According to certain embodiments, at least a portion of the first ground plane 223a may be arranged to face at least a portion of the second ground plane 223b. For example, the first ground plane 223a may be arranged to face the second ground plane 223b, and at least a portion of the first wiring layer 211a and at least a portion of the second wiring layer 211b may be arranged between the first ground plane 223a and the second ground plane 223b. In another embodiment, the first ground plane 223a and the second ground plane 223b may be arranged to face, at least in part, each other, and the signal lines 221a and 222a and/or the dummy lines 221b and 222b may be substantially arranged between the first ground plane 223a and the second ground plane 223b. In some embodiments, the ground planes 223a and 223b may provide an electromagnetic wave shielding structure to other areas (not shown) of the printed circuit board 200 or between the wiring layers and the signal lines 221a and 222a (or the dummy lines 221b and 222b). For example, when the signal lines 221a and 222a implement the 3-phase interfaces 201, 202 and 203 to transmit electric signals, the ground planes 223a and 223b may substantially play the role of blocking electrical interference that may occur between the signal lines 221a and 222a. Since the ground planes 223a and 223b serve to block electrical interference, it is possible to provide a stable signal transmission environment and prevent deterioration of the quality of transmitted signals.

According to various embodiments, the printed circuit board 200 may include a plurality of insulation layers 213a, 213b, and 213c. For example, the printed circuit board 200 may include a first insulation layer 213a arranged between the first wiring layer 211a and the second wiring layer 211b, a second insulation layer 213b arranged between the first wiring layer 211a and the third wiring layer 211c, and/or a third insulation layer 213c arranged between the second wiring layer 211b and the fourth wiring layer 211d. According to certain embodiments, in order to reduce the distance between the signal lines arranged in the same layer, the signal lines constituting the 3-phase interfaces may be formed based on the thickest insulation layer among a plurality of insulation layers that are previously formed.

According to certain embodiments, the reason why the signal lines are formed based on the thickest insulation layer is that when the thicknesses of the signal lines and the insulation layer are determined within a specific range, if the signal lines are formed based on the thickest insulation layer, it is possible to minimize interference with each other. For example, some of the insulation layers 213a, 213b, and 213c may be formed to be thicker than the remaining insulation layers. For example, when the printed circuit board 200 includes 12 wiring layers, the insulation layer formed between the two wiring layers arranged in the middle (for example, the $6^{th}$ and $7^{th}$ wiring layers) may be formed to be thicker than the remaining insulation layers. In some embodiments, the insulation layer formed between the first wiring layer 211a and the second wiring layer 211b (for example, the first insulation layer 213a) may be thicker than the remaining insulation layers (for example, the second insulation layer 213b or the third insulation layer 213c).

According to various embodiments, for example, embodiments according to the example provided by FIG. 2, the first insulation layer 213a may have a thickness of approximately 60 micrometers, and the second insulation layer 213b or the third insulation layer 213c may have a thickness of approximately 40 micrometers. For example, when design values for thicknesses of the insulation layers are determined in the printed circuit board 200, the maximum distance between the first wiring layer 211a and the second wiring layer 211b may be secured. In certain embodiments, if the thickness of the first insulation layer 213a is approximately 60 micrometers, the distance between the first signal line 221a and the second signal line 222a, which are adjacent to each other in a horizontal direction H, may be set to approximately 55 micrometers.

According to various embodiments, the above distance may minimize electromagnetic interference between the three selected signal lines 221a and 222a when the signal lines 221a and 222a are combined to form the 3-phase interfaces 201, 202, and 203, thereby reducing the distance between the signal lines (for example, the first signal lines 221a) arranged in the same layer (for example, the first wiring layer 211a). For example, in the case where the first wiring layer 211a and the second wiring layer 211b are formed with an insulation layer (for example, the second insulation layer 213b or the third insulation layer 213c) having a thickness of 40 micrometers interposed therebetween, the signal lines arranged in the same layer may be formed to have a distance greater than 55 micrometers (for example, approximately 60 micrometers or more). In some embodiments, when forming 3-phase interfaces by combining the signal lines (for example, the first signal line 221a and the second signal line 222a) arranged with the thickest insulation layer (for example, the first insulation layer 213a of 60 micrometers thick), among the insulation layers of a designed printed circuit board, interposed therebetween, even if the distance between the signal lines arranged in the same layer, among the signal lines of the 3-phase interfaces, is reduced, it is possible to secure an environment to minimize electromagnetic interference. In certain embodiments, by providing an electromagnetic shielding structure using the dummy lines 221b and 222b, the distance between the first signal line 221a and the second signal line 222a, which are adjacent to each other in the 3-phase interfaces 201, 202, and 203, may be configured to be different from each other. According to certain embodiments, the signal lines may be arranged close to each other in the horizontal direction when including a shielding structure (for example, the dummy line 221b). For example, the distance between the first signal line 221a and the second signal line 222a included in the first 3-phase interface 201, that is a first distance, may be set to, for example, 55 micrometers, and the distance between the second signal line 222a of the second 3-phase interface 202 and the first signal line 221a of the first 3-phase interface 201, that is a second distance, may be set to, for example, 60 micrometers by a shielding structure (for example, the dummy line 221b). As described above, the distance between the signal lines included in a single 3-phase interface may be configured to be different from the distance between the signal lines included in different 3-phase interfaces, and numerical values representing the distances are not intended to limit the disclosure. For example, the numerical values described in this document are only examples, and may be appropriately changed depending on specifications required for the actual electronic device to be manufactured.

According to various embodiments, the printed circuit board 200 may include a plurality of 3-phase interfaces 201, 202, and 203 depending on the number of first signal lines 221a and/or second signal lines 222a. For example, the printed circuit board 200 shown in FIG. 2 may include three 3-phase interfaces 201, 202, and 203. According to certain embodiments, in the case where a plurality of 3-phase interfaces 201, 202, and 203 are arranged adjacent to each other, the first 3-phase interface 201 and the second 3-phase interface 202 or the second 3-phase interface 202 and the third 3-phase interface 203 may be spaced at regular intervals. For example, two adjacent 3-phase interfaces may have a distance of at least 60 micrometers therebetween.

FIG. 3 illustrates, in enlarged plan view, an example of a printed circuit board 200 according to various embodiments of this disclosure, and illustrates in plan view, an example in which signal lines for providing 3-phase interfaces (for example, the 3-phase interfaces 201, 202, and 203 in FIG. 2) are compared between a printed circuit board 200 and an existing printed circuit board 20.

Referring to the non-limiting example of FIG. 3, three signal lines 21a, 21b, and 21c arranged on a single wiring layer may be combined in order to provide 3-phase interfaces to an existing printed circuit board 20. According to some embodiments, the wiring layer may be a layer (not shown) including wires, formed on the existing printed circuit board, for transmitting signals. Three signal lines may be arranged as close as possible in order to miniaturize the printed circuit board, but there may be a minimum distance required to suppress electromagnetic interference between the signal lines of the 3-phase interfaces. For example, when providing 3-phase interfaces by combining the signal lines 21a, 21b, and 21c having a line width of 30 micrometers in the existing printed circuit board 20, the signal lines 21a, 21b, and 21c may require a distance of 90 micrometers therebetween. It should be noted that the distance of 90 micrometers is the minimum experimentally obtained in order to suppress electromagnetic interference and is only an example, and this value is not intended to limit the disclosure.

As to the printed circuit board 200, according to various embodiments disclosed in this document, it has been described above that at least one of the three selected signal lines (for example, the first signal line 221a in FIG. 2) is arranged on the first wiring layer (for example, the first wiring layer 211a in FIG. 2), and at least another thereof (for example, the second signal line 222a in FIG. 2) is arranged on the second wiring layer (for example, the second wiring layer 211b in FIG. 2). For example, the first signal lines 221a and the first dummy line 221b are shown in FIG. 3, and the second signal line connected to a terminal end 331 (for example, the signal line overlapping the first dummy line 221b in FIG. 3, among the second signal lines 222a in FIG. 2) may be combined with the first signal lines 221a to form 3-phase interfaces. The second signal line 222a connected to the terminal end 331 may be formed on a wiring layer different from the first signal line 221a, and may be arranged to overlap the first dummy line 221b in the state shown in FIG. 3. It has been described in the embodiment shown in FIG. 2 that the distance between two adjacent signal lines (for example, the first signal line 221a and the second signal line 222a adjacent thereto in FIG. 2) is approximately 55 micrometers in the horizontal direction H. For example, the width W2 at which the signal lines 221a and 222a are arranged on the printed circuit board 200 according to various embodiments disclosed in this document may be smaller than the width W1 at which the signal lines 21a, 21b, and 21c constituting 3-phase interfaces are arranged on the existing printed circuit board 20. Hereby, the printed circuit board 200 according to various embodiments disclosed in this document may reduce the area R where the signal lines 221a and 222a are arranged, thereby facilitating miniaturization thereof, and may make it possible to arrange more signal lines with respect to the printed circuit boards of the same size using the arrangement structure of the signal lines disclosed in this document.

As the distance between the signal lines (for example, the signal lines 221a and 222a in FIG. 2) is reduced, there may be a risk of degradation of performance due to electromagnetic interference between the signal lines 221a and 222a in the 3-phase interfaces (for example, the 3-phase interfaces 201, 202, and 203 in FIG. 2). However, the printed circuit board 200 according to various embodiments disclosed in this document may provide an electromagnetic wave shielding structure using dummy lines (for example, the dummy lines 221b and 222b in FIG. 2), thereby providing the signal transmission quality at least equal to that of an existing printed circuit board 20 while being miniaturized. This will be described with reference to the non-limiting examples of FIGS. 4 to 6.

Figure 4:
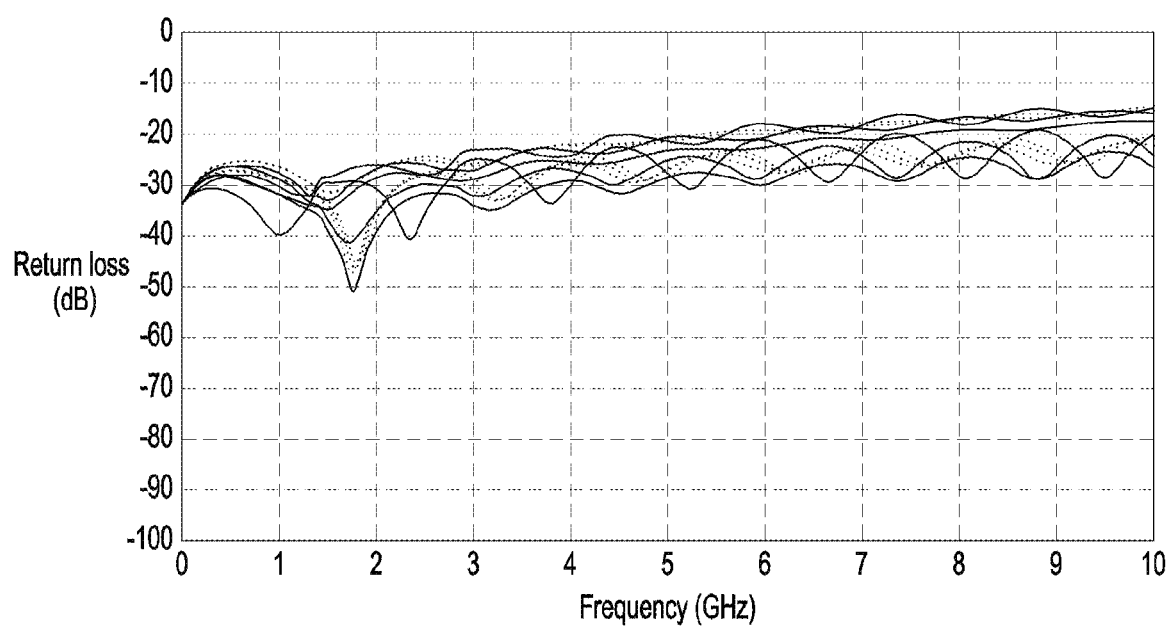
FIG. 4 is a graph showing measurements of return loss of 3-phase interfaces in a printed circuit board, according to various embodiments of this disclosure.
Figure 5:
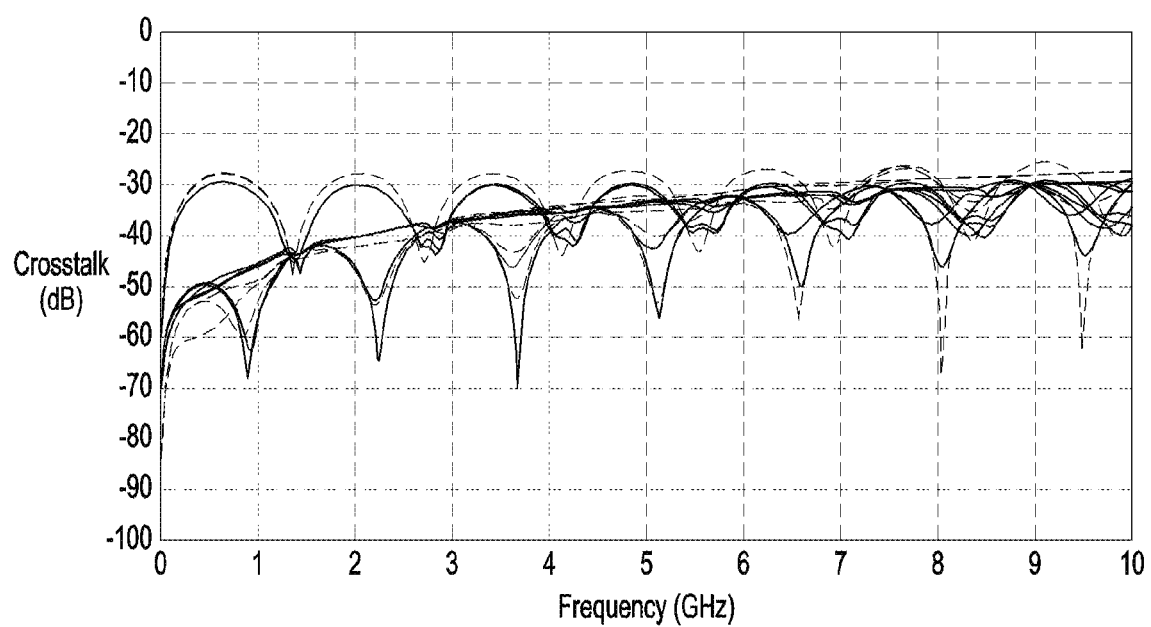
FIG. 5 is a graph showing measurements of crosstalk of 3-phase interfaces in a printed circuit board, according to various embodiments of this disclosure.
Figure 6:
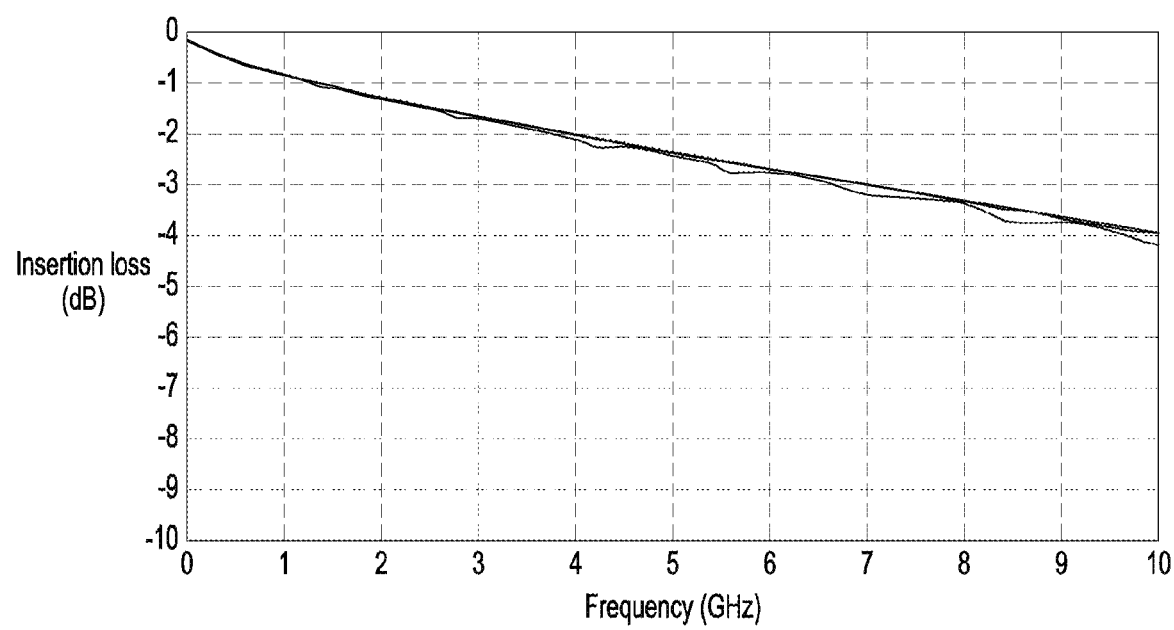
FIG. 6 is a graph showing measurements of insertion loss of 3-phase interfaces in a printed circuit board, according to various embodiments of this disclosure.

FIG. 4 is a graph illustrating the measurement of return loss of 3-phase interfaces (for example, the 3-phase interfaces 201, 202, and 203 in FIG. 2) in a printed circuit board (for example, the printed circuit board 200 in FIG. 2 or 3) according to various embodiments of this disclosure. FIG. 5 is a graph illustrating the measurement of crosstalk of 3-phase interfaces in a printed circuit board according to various embodiments of this disclosure. FIG. 6 is a graph illustrating the measurement of insertion loss of 3-phase interfaces in a printed circuit board according to various embodiments of this disclosure.

In the illustrative examples of FIG. 4 to FIG. 6, dotted lines represent the results of measuring the transmission quality of an existing printed circuit board (for example, the printed circuit board indicated by reference number "20" in FIG. 3), and solid lines represent the results of measuring the transmission quality of the printed circuit board (for example, the printed circuit board 200 in FIG. 2 or FIG. 3) according to various embodiments of this disclosure.

Return loss may denote the loss caused by the wave returning to the incident side due to a reflected wave that may be generated by a terminal end of the signal line, such as a connection portion or a connector, when transmitting a signal. It is possible to predict or identify the loss to a signal actually transmitted and the amount of transmission by measuring return loss. For example, return loss may indicate the ratio of reflected power to input power, and return loss RL may be obtained using the equation "$RL=-10 \log(Pr/Pi)$". If return loss is 3 [dB], half of input power may be lost and the remaining half may be transmitted. Referring to FIG. 4, it can be seen that there is no significant difference in return loss between the printed circuit board according to various embodiments disclosed in this document (for example, the printed circuit board 200 in FIG. 2 or FIG. 3) and an existing printed circuit board (for example, the printed circuit board indicated by reference number "20" in FIG. 3).

Cross-talk is an indicator of transmission of signals and noise due to coupling between the signal lines. For example, in the case where two signal lines are parallel to each other, noise may occur due to the stray capacitance (parasitic capacitance) and mutual inductance between the two signal lines. Cross-talk may denote conduction noise generated between the signal lines when transmitting and receiving signals. Referring to the illustrative example of FIG. 5, it can be confirmed that there is no significant difference in cross-talk when transmitting/receiving signals using the existing printed circuit board 20 and the printed circuit board 200 according to various embodiments disclosed in this document, which means that, actually, there is no difference in performance using cross-talk as an indicator.

Insertion loss is obtained by measuring output power to input power, and is an index indicating the power lost inside a device or a circuit. Insertion loss IL may be obtained using the equation "$IL=-10 \log(Pout/Pin)$". For example, if the insertion loss is 0 [dB], it may indicate that the ratio of output to input is 1. For example, if the insertion loss is 0 [dB], it may indicate that the input power is fully output. Actually, it is not likely that there is no loss at all in various devices, circuits, or the signal lines disclosed in this document, so the insertion loss may be measured to a value of 0 [dB] or less. Referring to the example of FIG. 6, it can be confirmed that as the frequency of a transmitted signal increases, the insertion loss may generally increase, and that the printed circuit board 200 has substantially the same characteristic as the existing printed circuit board 20 over a measurement frequency band.

As described with reference to the illustrative examples of FIG. 4 to FIG. 6, the printed circuit board 200 according to various embodiments of this disclosure may provide an electromagnetic shielding structure between the signal lines (for example, the signal lines 221a and 222a in FIG. 2) using the dummy lines (for example, the dummy lines 221b and 222b in FIG. 2) while being smaller than the existing printed circuit board 20, thereby providing the same transmission quality or performance. In some embodiments, in the case of the same size (for example, area), the printed circuit board 200 according to various embodiments disclosed in this document may include more signal lines than the existing printed circuit board 20, and may be easy to provide high-speed transmission lines such as 3-phase interfaces (for example, the 3-phase interfaces 201, 202, and 203 in FIG. 2).

Figure 7:
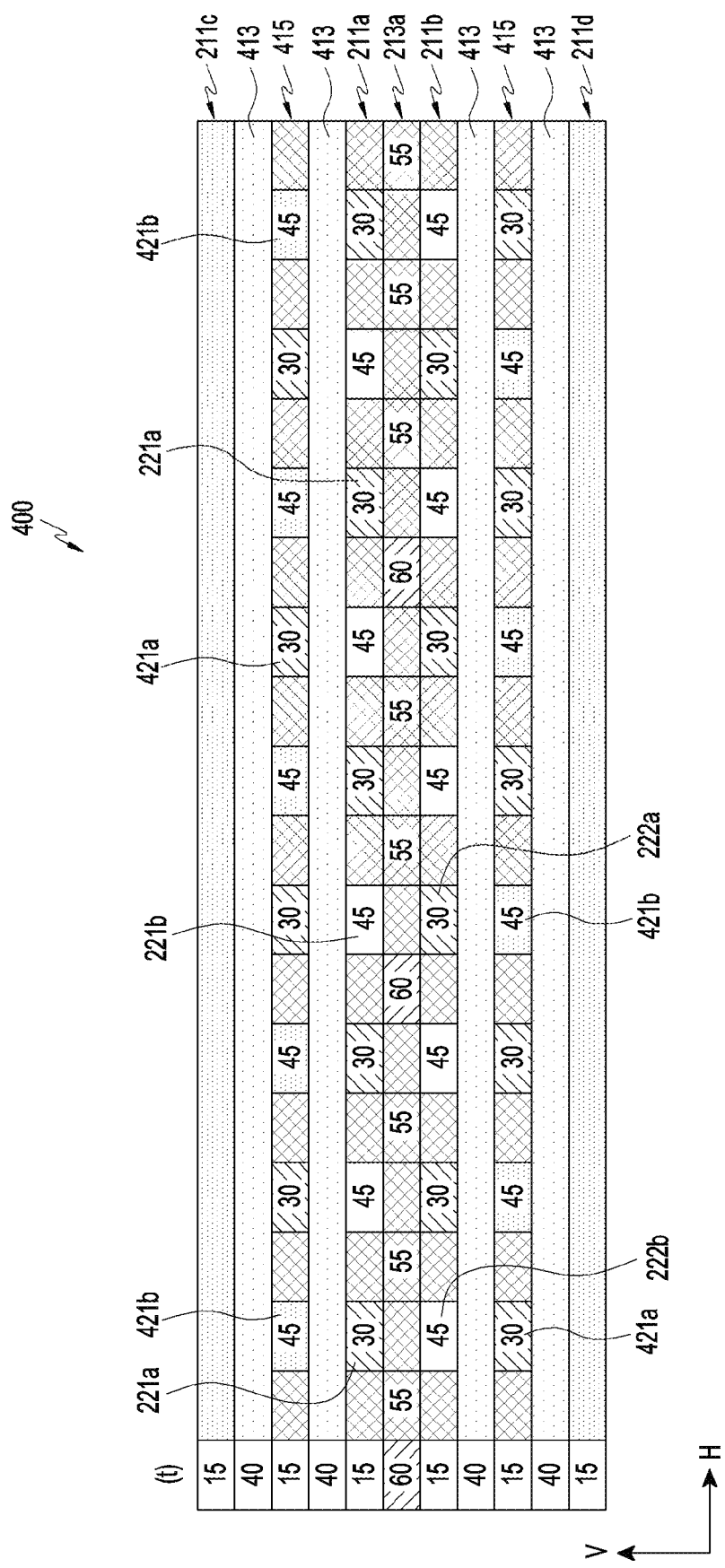
FIG. 7 illustrates, in cross-sectional view, an example of the configuration of a printed circuit board according to various embodiments of this disclosure.

FIG. 7 illustrates, in cross-sectional view, an example of a configuration a printed circuit board 400 according to various embodiments of this disclosure.

Referring to the non-limiting example of FIG. 7, a printed circuit board 400 according to various embodiments of this disclosure may further include at least one of the fifth wiring layers 415. FIG. 7 illustrates examples of configurations in which a fifth wiring layer 415 is arranged between the first wiring layer 211a and the third wiring layer 211c, and another fifth wiring layer 415 is arranged between the second wiring layer 211b and the fourth wire 211d, respectively. However, the disclosure is not limited thereto, and the fifth wiring layer 415 may be arranged in any one of the areas between the first wiring layer 211a and the third wiring layer 211c and between the second wiring layer 211b and the fourth wiring layer 211d. In certain embodiments, the fifth wiring layer 415 may include a plurality of third signal lines 421a and a plurality of third dummy lines 421b, and the third signal lines 421a and the third dummy lines 421b may be alternately arranged with each other in the horizontal direction H. In some embodiments, when the printed circuit board 400 is viewed from above, the third signal line(s) 421a may be arranged to overlap the first dummy line 221b or the second dummy line 222b, and the third dummy line(s) 421b may be arranged to overlap the first signal line 221a or the second signal line 222a.

According to various embodiments, in the case where the fifth wiring layer 415 is arranged between the first wiring layer 211a and the third wiring layer 211c, each of the third signal lines 421a may arranged to face one of the first dummy lines 221b, and each of the third dummy lines 421b may be arranged to face one of the first signal lines 221a. In certain embodiments, in the case where the fifth wiring layer 415 is arranged between the second wiring layer 211b and the fourth wiring layer 211d, each of the third signal lines 421a may be arranged to face one of the second dummy lines 222b, and each of the third dummy lines 421b may be arranged to face one of the second signal lines 222a. The third signal lines 421a may be combined with the first signal line(s) 221a or the second signal line(s) 222a, which are adjacent thereto, to form an additional 3-phase interface. In some embodiments, if the fifth wiring layer 415 is added, the height (or thickness) thereof may increase, whereas distances between the respective wires may be reduced. For example, if the fifth wiring layer 415 is added, when viewed from above, although the distance between the wires (for example, the signal lines described above) is reduced, the diagonal distance between the respective layers increases, thereby suppressing electromagnetic interference. In certain embodiments, the third signal lines 421a or the third dummy lines 421b may be used as wires for transmitting electrical signals different from the first signal line(s) 221a or the second signal line(s) 222a.

According to various embodiments disclosed in this document, a printed circuit board (for example, the printed circuit board 200 or 400 in FIG. 2 or 7) may include: a first wiring layer (for example, the first wiring layer 211a in FIG. 2) including at least one first signal line (for example, the first signal line 221a in FIG. 2 or 7) and at least one first dummy line (for example, the first dummy line 221b in FIG. 2 or 7); and a second wiring layer arranged on the first wiring layer and including at least one second signal line (for example, the second signal line 222a in FIG. 2 or 7) and at least one second dummy line (for example, the second dummy line 222b in FIG. 2 or 7), wherein when the printed circuit board is viewed from above, the at least one first signal line may be arranged to overlap, at least in part, the at least one second dummy line, and the at least one second signal line may be arranged to overlap, at least in part, the at least one first dummy line.

According to various embodiments, the printed circuit board may be configured to transmit a signal using the at least one first signal line and the at least one second signal line.

According to various embodiments, the printed circuit board may be configured to transmit a differential signal using at least one of the at least one first signal line and the at least one second signal line.

According to various embodiments, the plurality of first dummy lines may be alternately arranged with the plurality of first signal lines; the plurality of second dummy lines may be alternately arranged with the plurality of second signal lines; and the plurality of first dummy lines or the plurality of second dummy lines may be configured to block, at least in part, electromagnetic waves generated from the plurality of first signal lines or the plurality of second signal lines.

According to various embodiments, the printed circuit board may include: a third wiring layer (for example, the third wiring layer 211c in FIG. 2) including a first ground plane (for example, the first ground plane 223a in FIG. 2); and a fourth wiring layer (for example, the fourth wiring layer 211d in FIG. 2) including a second ground plane (for example, the second ground plane 223b in FIG. 2), wherein the first wiring layer and the second wiring layer may be arranged between the third wiring layer and the fourth wiring layer.

According to various embodiments, at least a portion of the first ground plane may be arranged to face at least a portion of the second ground plane with the first wiring layer and the second wiring layer interposed therebetween, and the first signal lines, the first dummy lines, the second signal lines, and the second dummy lines may be arranged between the first ground plane and the second ground plane.

According to various embodiments, the printed circuit board may further include at least one fifth wiring layer (for example, the fifth wiring layer 415 in FIG. 7) arranged on the first wiring layer or the second wiring layer, and the fifth wiring layer may include: third dummy lines (for example, the third dummy lines 421b in FIG. 7) arranged to face one of the first signal lines or one of the second signal lines, respectively; and third signal lines (for example, the third signal lines 421a in FIG. 7) arranged to face one of the first dummy lines or one of the second dummy lines, respectively.

According to various embodiments, line widths of the first dummy line and the second dummy line may be greater than line widths of the first signal line and the second signal line.

According to various embodiments, the printed circuit board may further include: a first insulation layer (for example, the first insulation layer 213a in FIG. 2) arranged between the first wiring layer and the second wiring layer; a second insulation layer (for example, the second insulation layer 213b in FIG. 2) arranged on the first wiring layer; and a third insulation layer (for example, the third insulation layer 213c in FIG. 2) arranged on the second wiring layer.

According to various embodiments, the first insulation layer may be formed to be thicker than the second insulation layer and the third insulation layer.

According to various embodiments, at least some of the first dummy lines and the second dummy lines may be connected to a ground plane (for example, the ground planes 223a and 223b in FIG. 2) of the printed circuit board.

According to various embodiments disclosed in this document, an electronic device may include: a printed circuit board; a processor (for example, the processor 120 in FIG. 1); and at least one electronic component (for example, at least one of the memory 130, the audio module 170, the sensor module 176, the interface 177, the camera module 180, or the communication module 190 in FIG. 1) electrically connected to the processor through the printed circuit board, and the printed circuit board may include: a first wiring layer including a plurality of first signal lines and a plurality of first dummy lines; and a second wiring layer including a plurality of second signal lines and a plurality of second dummy lines, wherein each of the first signal lines may be arranged to face one of the second dummy lines, and each of the second signal lines may be arranged to face one of the first dummy lines, and wherein the processor may be configured to transmit or receive an electrical signal to or from the electronic component through signal lines selected from the first signal lines and the second signal lines.

According to various embodiments, the selected signal lines may include at least one of the first signal lines and at least one of the second signal lines, which are adjacent to each other.

According to various embodiments, the processor may be configured to transmit or receive a differential signal through two of the selected signal lines.

According to various embodiments, the printed circuit board may further include: a third wiring layer including a first ground plane; and a fourth wiring layer including a second ground plane, wherein at least a portion of the first ground plane may be arranged to face at least a portion of the second ground plane, and wherein the first signal lines, the first dummy lines, the second signal lines, and the second dummy lines may be arranged between the first ground plane and the second ground plane.

According to various embodiments, the first wiring layer and the second wiring layer may be arranged between the first ground plane and the second ground plane.

According to various embodiments, the printed circuit board may further include at least one fifth wiring layer arranged on the first wiring layer or the second wiring layer, and the fifth wiring layer may include: third dummy lines arranged to face one of the first signal lines or one of the second signal lines, respectively; and third signal lines arranged to face one of the first dummy lines or one of the second dummy lines, respectively.

According to various embodiments, the electronic component may include at least an optical sensor, and the processor may be configured to receive an image signal obtained from the electronic component through the at least one first signal line and the at least one second signal and process the same.

According to various embodiments, the electronic component may include at least a display, and the processor may be configured to transmit a control signal for driving the electronic component using the at least one first signal line and the at least one second signal line.

According to various embodiments, the printed circuit board may include a flexible printed circuit board.

As described above, although specific embodiments have been described in the detailed description in this document, it will be obvious to those skilled in the art that various modifications are possible without departing from the scope of the disclosure. For example, it will be understood that FIG. 2 illustrates an example of part of a printed circuit board, and an actual printed circuit board may include areas, which are not shown in the horizontal direction H, and additional wiring layers and insulation layers, which are not shown in the vertical direction V.

Although the present disclosure has been described with various embodiments, various changes and modifications may be suggested to one skilled in the art. It is intended that the present disclosure encompass such changes and modifications as fall within the scope of the appended claims.

What is claimed is:

1. A printed circuit board comprising: a first wiring layer comprising a plurality of first signal lines and a plurality of first dummy lines; and a second wiring layer arranged on the first wiring layer and comprising a plurality of second signal lines and a plurality of second dummy lines, wherein when the printed circuit board is viewed from above, each of the plurality of first signal lines is arranged to overlap, at least in part, one of the plurality of second dummy lines, and the plurality of second signal lines is arranged to overlap, at least in part, one of the plurality of first dummy lines, and wherein the printed circuit board is configured to provide a plurality of 3-phase interfaces by combining one of the plurality of first signal lines with two of the plurality of second signal lines adjacent thereto to form a first 3-phase interface and combining one of the plurality of second signal lines with two of the plurality of first signal lines adjacent thereto to form a second 3-phase interface, and wherein a first distance between the first signal line and the second signal line included in any one of the first 3-phase interface and the second 3-phase interface is smaller than a second distance between the second signal line of the second 3-phase interface and the first signal line of the first 3-phase interface.

2. The printed circuit board of claim 1, wherein the printed circuit board is configured to transmit a signal using at least one of the plurality of first signal lines and at least one of the plurality of second signal lines.

3. The printed circuit board of claim 2, wherein the printed circuit board is configured to transmit a differential signal using at least one of the plurality of first signal lines and at least one of the plurality of second signal lines.

4. The printed circuit board of claim 2, wherein the plurality of first dummy lines are alternately arranged with the plurality of first signal lines,
   wherein the plurality of second dummy lines are alternately arranged with the plurality of second signal lines, and
   wherein the plurality of first dummy lines or the plurality of second dummy lines are configured to block, at least in part, electromagnetic waves generated from the plurality of first signal lines or the plurality of second signal lines.

5. The printed circuit board of claim 1, further comprising:
   a third wiring layer comprising a first ground plane; and
   a fourth wiring layer comprising a second ground plane,
   wherein the first wiring layer and the second wiring layer are arranged between the third wiring layer and the fourth wiring layer.

6. The printed circuit board of claim 5, wherein at least a portion of the first ground plane is arranged to face at least a portion of the second ground plane with the first wiring layer and the second wiring layer interposed therebetween, and
   wherein the plurality of first signal lines, the plurality of first dummy lines, the plurality of second signal lines, and the plurality of second dummy lines are arranged between the first ground plane and the second ground plane.

7. The printed circuit board of claim 1, further comprising at least one fifth wiring layer arranged on the first wiring layer or the second wiring layer,
   wherein the fifth wiring layer comprises:
      third dummy lines arranged to face one of the plurality of first signal lines or one of the plurality of second signal lines, respectively; and
      third signal lines arranged to face one of the plurality of first dummy lines or one of the plurality of second dummy lines, respectively.

8. The printed circuit board of claim 1, wherein line widths of the plurality of first dummy lines and the plurality of second dummy lines are greater than line widths of the plurality of first signal lines and the plurality of second signal lines.

9. The printed circuit board of claim 1, further comprising:
   a first insulation layer arranged between the first wiring layer and the second wiring layer;
   a second insulation layer arranged on the first wiring layer; and
   a third insulation layer arranged on the second wiring layer.

10. The printed circuit board of claim 9, wherein the first insulation layer is formed to be thicker than the second insulation layer and the third insulation layer.

11. The printed circuit board of claim 1, wherein at least some of the plurality of first dummy lines and the plurality of second dummy lines are connected to a ground plane of the printed circuit board.

12. An electronic device comprising: a printed circuit board; a processor; and at least one electronic component electrically connected to the processor through the printed circuit board, wherein the printed circuit board comprises: a first wiring layer comprising a plurality of first signal lines and a plurality of first dummy lines; and a second wiring layer comprising a plurality of second signal lines and a plurality of second dummy lines, wherein each of the first signal lines is arranged to face one of the second dummy lines, and each of the second signal lines is arranged to face one of the first dummy lines, wherein the printed circuit board is configured to provide a plurality of 3-phase interfaces by combining one of the plurality of first signal lines with two of the plurality of second signal lines adjacent thereto to form a first 3-phase interface and combining one of the plurality of second signal lines with two of the plurality of first signal lines adjacent thereto to form a second 3-phase interface, wherein a first distance between the first signal line and the second signal line included in any one of the first 3-phase interface and the second 3-phase interface is smaller than a second distance between the second signal line of the second 3-phase interface and the first signal line of the first 3-phase interface, and wherein the processor is configured to transmit or receive an electrical signal to or from the electronic component through the 3-phase interfaces.

13. The electronic device of claim 12, wherein the processor is configured to transmit or receive a differential signal through two signal lines in the 3-phase interfaces.

14. The electronic device of claim 12, wherein the printed circuit board further comprises:
   a third wiring layer comprising a first ground plane; and
   a fourth wiring layer comprising a second ground plane,
   wherein at least a portion of the first ground plane is arranged to face at least a portion of the second ground plane, and
   wherein the first signal lines, the first dummy lines, the second signal lines, and the second dummy lines are arranged between the first ground plane and the second ground plane.

15. The electronic device of claim 14, wherein the first wiring layer and the second wiring layer are arranged between the first ground plane and the second ground plane.

16. The electronic device of claim 12, wherein the printed circuit board further comprises at least one fifth wiring layer arranged on the first wiring layer or the second wiring layer, and
   wherein the fifth wiring layer comprises:
      third dummy lines arranged to face one of the first signal lines or one of the second signal lines, respectively; and
      third signal lines arranged to face one of the first dummy lines or one of the second dummy lines, respectively.

17. The electronic device of claim 12, wherein the electronic component comprises at least an optical sensor, and
   wherein the processor is configured to receive an image signal obtained from the electronic component through at least one first signal line of the plurality of first signal lines and at least one second signal line of the plurality of second signal lines and process the image signal.

18. The electronic device of claim 12, wherein the electronic component comprises at least a display, and
   wherein the processor is configured to transmit a control signal for driving the electronic component using at least one first signal line of the plurality of first signal lines and at least one second signal line of the plurality of second signal lines.

19. The electronic device of claim 12, wherein the printed circuit board comprises a flexible printed circuit board.

* * * * *